(12) United States Patent
Melanson

(10) Patent No.: US 7,271,666 B1
(45) Date of Patent: Sep. 18, 2007

(54) METHOD AND APPARATUS FOR CANCELING JITTER IN A FRACTIONAL-N PHASE-LOCK LOOP (PLL)

(75) Inventor: John Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 80 days.

(21) Appl. No.: 11/232,650

(22) Filed: Sep. 22, 2005

(51) Int. Cl.
H03L 7/00 (2006.01)

(52) U.S. Cl. .................... 331/16; 331/177 R; 332/127; 332/128; 455/260

(58) Field of Classification Search ................ 331/16, 331/177 R; 332/127, 128; 455/260
See application file for complete search history.

(56) References Cited

U.S. PATENT DOCUMENTS 4,204,174 A   5/1980   King
5,825,253 A   10/1998  Mathe et al.

OTHER PUBLICATIONS

Pamarti et al., "A wideband 2.4 GHz delta-sigma franctional-N PLL with a Mb/s in-loop modulation," IEEE J. Solid-State Cir., 39(1):49-62, Jan. 2004.

Galton, I., "Fractional-N phase locked loops for frequency synthesis," Silicon Labs Distinguished Seminar on Mixed Signal Design, Univ. of Texas at Austin, Mar. 25, 2003.

Galton, I., "Delta-sigma franctional-N phase-locked loops," from Phase-Locking in High Performance Systems: From Devices to Architectures, Behzad Razavi, Wiley-IEEE Press, Feb. 2003, p. 23-33.

*Primary Examiner*—Arnold Kinkead
(74) *Attorney, Agent, or Firm*—Andrew M. Harris; Mitch Harris, Atty at Law, LLC

(57) ABSTRACT

A method and apparatus improves the stability and noise performance of frequency synthesis and synchronization circuits. A cancellation circuit provides an error signal that is a measure of integrated quantization error in a delta-sigma modulator that controls the ratiometric division factor in a fractional-N phase-lock loop (PLL). The error signal is fed to the loop filter of the phase-lock loop as a correction signal via a differentiator (high-pass filter). The high pass filter removes substantially all in-band components from the cancellation signal, which reduces the linearity requirement on the cancellation signal path. The cancellation signal can be tapped from an internal numerical integrator of the delta-sigma modulator that is then converted to an analog signal, that is then filtered and combined with the phase comparator output in the loop filter.

20 Claims, 3 Drawing Sheets

METHOD AND APPARATUS FOR CANCELING JITTER IN A FRACTIONAL-N PHASE-LOCK LOOP (PLL)

BACKGROUND OF THE INVENTION

1. Field of the Invention

The present invention relates generally to phase-lock loop systems, and more specifically, to a method and system for canceling jitter in fractional-N phase lock loop circuits.

2. Background of the Invention

Phase-lock loop (PLL) circuits are used abundantly in audio and video processing systems, communications systems and in other systems such as processing systems where generation of a clock having a selectable or synchronized frequency is required. In many applications, it is desirable to generate a selectable frequency other than a simple multiple or division of a reference clock frequency. Circuits such as synthesizers provide a programmable frequency from a reference using a PLL.

In order to control the frequency of an oscillator in small frequency increments using a PLL, in the past it was necessary to generate a much higher output frequency than the desired output frequency. The PLL output frequency was controlled by dividing the generated frequency by one numeric value and comparing its phase to a reference frequency that was divided by another numeric value. The resultant output frequency after division was determined by the ratio of the two divisors in the above operations and the system provided thereby is known as a ratiometric synthesizer and the frequency provided thereby has a rational relationship to the reference frequency. However, in order to provide a frequency selectivity on the order of 1 percent, the oscillator output frequency and reference frequency typically needed to be 100 times greater than the desired output frequency.

More recently, fractional-N PLLs have been developed that can provide a rationally related frequency from a reference without requiring generation of a high output frequency from the oscillator. Fractional-N PLLs provide a rational frequency control relationship by providing a "rational frequency divider" operation that approximates a rational division over the long-term by generating pulses that do not conform to a simple integer division of the oscillator output. As long as the PLL loop time constant is low compared to any beat frequencies that would otherwise be generated in the loop, the output frequency of the PLL's oscillator can be set to a rational multiple of the reference clock frequency. However, the rational frequency divider operation generally either requires a very low loop bandwidth in order to filter the dithering noise generated by the rational approximation, or the noise must somehow be shaped to fall outside of the filter bandwidth.

One technique that has been applied in fractional-N PLL circuits is to use a delta-sigma modulator to shape the noise spectrum introduced by the rational frequency division pulses, by generating pulses that have a noise spectrum that falls outside of the loop bandwidth, such as the PLL disclosed in U.S. Pat. No. 5,825,253, the specification of which is incorporated herein by reference. Although it is the reference clock that is rationally divided in the above-incorporated patent, the rational frequency division can be applied at either input to the phase comparator. Such techniques permit a much wider loop bandwidth for the PLL and thus a faster lock time and wider capture range.

The delta-sigma modulator approach provides a stable PLL that is rationally programmable over a wide range of frequency values. However, there is typically a significant residual amount of jitter (phase noise) present that is within the bandwidth of the loop.

Another example of fractional-N PLL jitter reduction through noise shaping is disclosed in U.S. Patent Application Publication No. US20050169419A1 by the inventor of the present application and assigned to the same assignee, and which is incorporated herein by reference. The above-incorporated U.S. patent application discloses a delta-sigma modulator used to generate a rational division in the PLL feedback look and using an improved phase-frequency detector that shapes the output noise spectrum by increasing the effective resolution of the digital phase comparator.

Another technique that has been applied to reduce jitter in a delta-sigma modulator driven fractional-N PLL is to introduce a correction signal that directly calculates the delta-sigma quantization error that is observed between the input and the output of the modulator and applies a correction voltage to the loop filter and thus the oscillator. The effect of the correction signal is to directly remove jitter (phase noise) due to the quantization error in the modulator. However, the entire cancellation signal path must be highly linear in order not only to achieve cancellation of the jitter but also to ensure that additional artifacts are not added within the loop bandwidth of the PLL.

Therefore, it would be desirable to provide a method and apparatus for canceling jitter in a fractional-N PLL that reduces jitter (phase noise) in the output of the PLL with low sensitivity to non-linearities in the cancellation circuit. It would further be desirable to accomplish such cancellation without requiring much additional circuitry for implementation.

SUMMARY OF THE INVENTION

The above stated objectives are achieved in a method and apparatus for canceling jitter in a fractional N-PLL. The fractional-N PLL includes at least a voltage controlled oscillator having a control voltage input that receives an output of a loop filter and an output coupled to a divider that provides an input to a phase comparator. The phase comparator provides an input to the loop filter representing a phase error between a reference clock and a clock derived from the oscillator output. A delta-sigma modulator periodically adjusts the effective ratio between a reference clock frequency and the voltage controlled oscillator's output frequency. A cancellation circuit providing an analog signal corresponding to quantization error in the delta-sigma modulator is coupled to a second input of the loop filter via differentiator (high pass filter).

The divider controlled by the delta-sigma modulator may be the divider coupling the output of the voltage controlled oscillator to the phase comparator input, or may be a divider employed to divide the reference clock at the second input to the phase comparator. The analog differentiator may be supplied from an external digital-to-analog converter that receives a numeric value corresponding to the output of an integrator within the delta-sigma modulator, or a separate integrator may be employed that integrates the difference between the input and the output of the delta-sigma modulator.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for reducing jitter (phase noise) in a delta-sigma fractional-N phase-lock loop (PLL). The method and apparatus generate a jitter cancellation signal by twice integrating the delta-sigma modulator quantization error, converting the integrated error to an analog value and then high-pass filtering the integrated error in the analog domain to produce the cancellation signal. The resultant phase of the cancellation signal is thus −90 degrees making it proper for subtraction at the input to the loop filter along with the phase comparator output. The high-pass filtering removes noise components of the error signal that are in the loop bandwidth, permitting removal of out-of-band error introduced at the fractional-N divider and reflected through the phase comparator, without requiring a high degree of linearity in the cancellation signal that would otherwise be required if the direct (single-integrated) delta-sigma error signal were subtracted from the loop filter.

Figure 1:
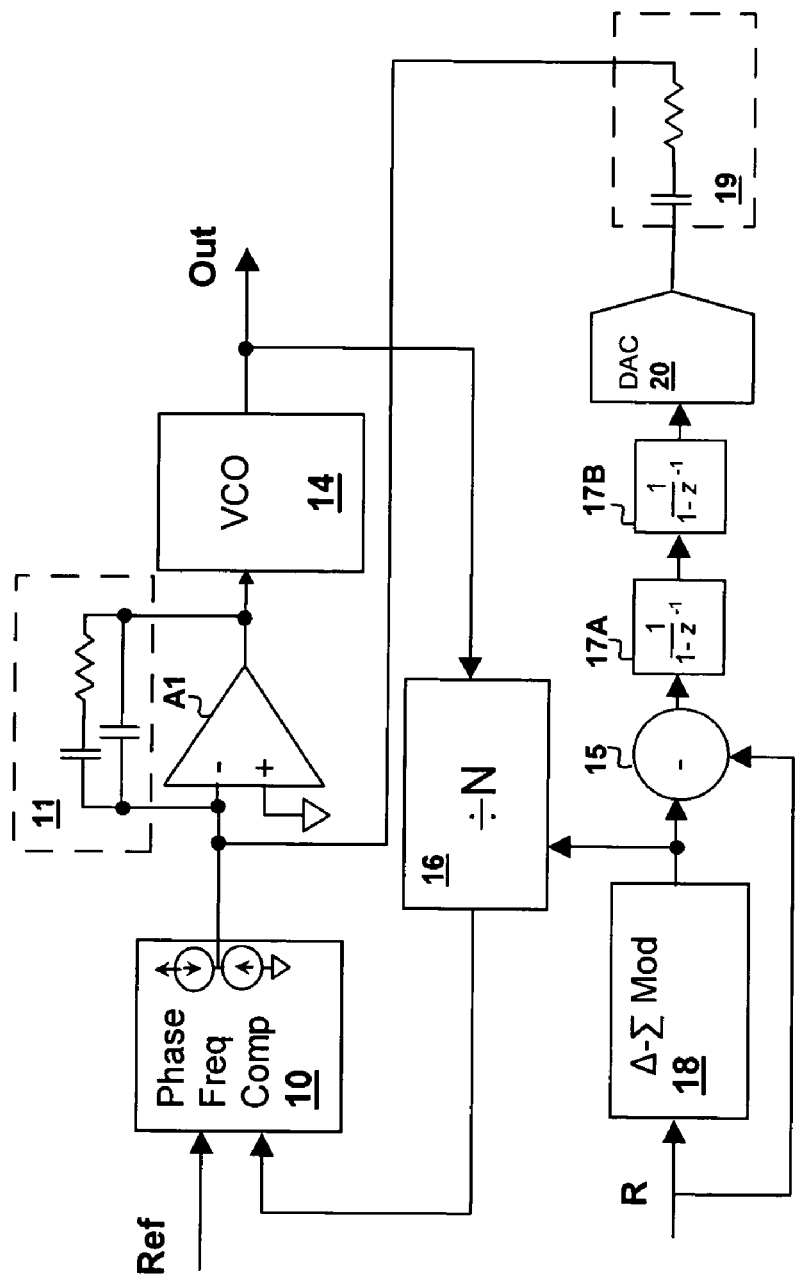
FIG. 1 is a block diagram depicting an apparatus in accordance with an embodiment of the present invention.

Referring now to FIG. 1, a fractional-N phase-lock loop in accordance with an embodiment of the present invention is shown. A voltage-controlled oscillator (VCO) 14 generates a timebase output signal provided as a digital output signal Out in the depicted embodiment. A phase/frequency comparator 10 compares a reference clock signal Ref to an output of a divider 16 that divides the timebase signal by an integer divisor N that is adjusted dynamically in accordance with an adjustment number provided by a delta-sigma modulator 18. The output of delta-sigma modulator 18 is generally several bits wide (e.g., 3 to 6 bits) and divider 16 adjusts the division factor of divider 16 in conformity with the instantaneous value received from the output of the delta-sigma modulator 18. Delta-sigma modulator 18 receives a numerical value R that corresponds to a rational number and thereby sets a rational relationship between the reference clock and the VCO 14 output Out by forcing the average divisor of divider 16 to correspond to a ratio that may be fixed or modulated, depending on whether or not R is a fixed or changing value.

The output of delta-sigma modulator 18 is subtracted from the ratio input by a subtractor 15 that externally measures the quantization error of delta-sigma modulator 18. The output of subtractor 15 is integrated by a pair of non-delaying integrators 17A and 17B (it will be shown below with respect to FIGS. 2 and 3 that the delta-sigma modulator itself can produce the integrated value). The integrated quantization error is then converted via a digital-to-analog converter (DAC) 20 to an analog signal that is provided through an RC network 19 to the loop filter formed by amplifier A1 and feedback network 11. RC network 19 is shown as a voltage input to the loop filter from a voltage output provided by DAC 20, but it will be understood that equivalent forms of low-pass filter can be used, e.g., a shunt resistor and a current-mode DAC. The loop filter is shown as a second-order low-pass filter with two poles and a zero, as is generally applied in phase-lock loops. It will also be understood that the jitter correction signal can be doubly-integrated from the quantization error by a variety of methods and circuits, including direct double-integration operations as well as cascaded integrators having outputs that combine other terms that alter the transfer function somewhat from pure double integration, but substantially perform sequential integration of the computed error values.

The depicted circuit thus attenuates components of quantization error of delta-sigma modulator 18 that are outside of the loop bandwidth, but not components that are within the loop bandwidth, which should generally be compensated by the loop anyway. If the low-frequency components of the cancellation signal were not removed by network 19, then DAC 20 (along with integrators 17A and 17B in the present example) would have to be highly linear in order to not introduce distortion into the loop that would appear as additional phase noise or low frequency tones. It will also be understood that other forms of high-pass filtering can be applied after DAC 20 such as a discrete high-pass filter of higher-order that is implemented with another op-amp separate from loop filter amplifier A1.

Figure 2:
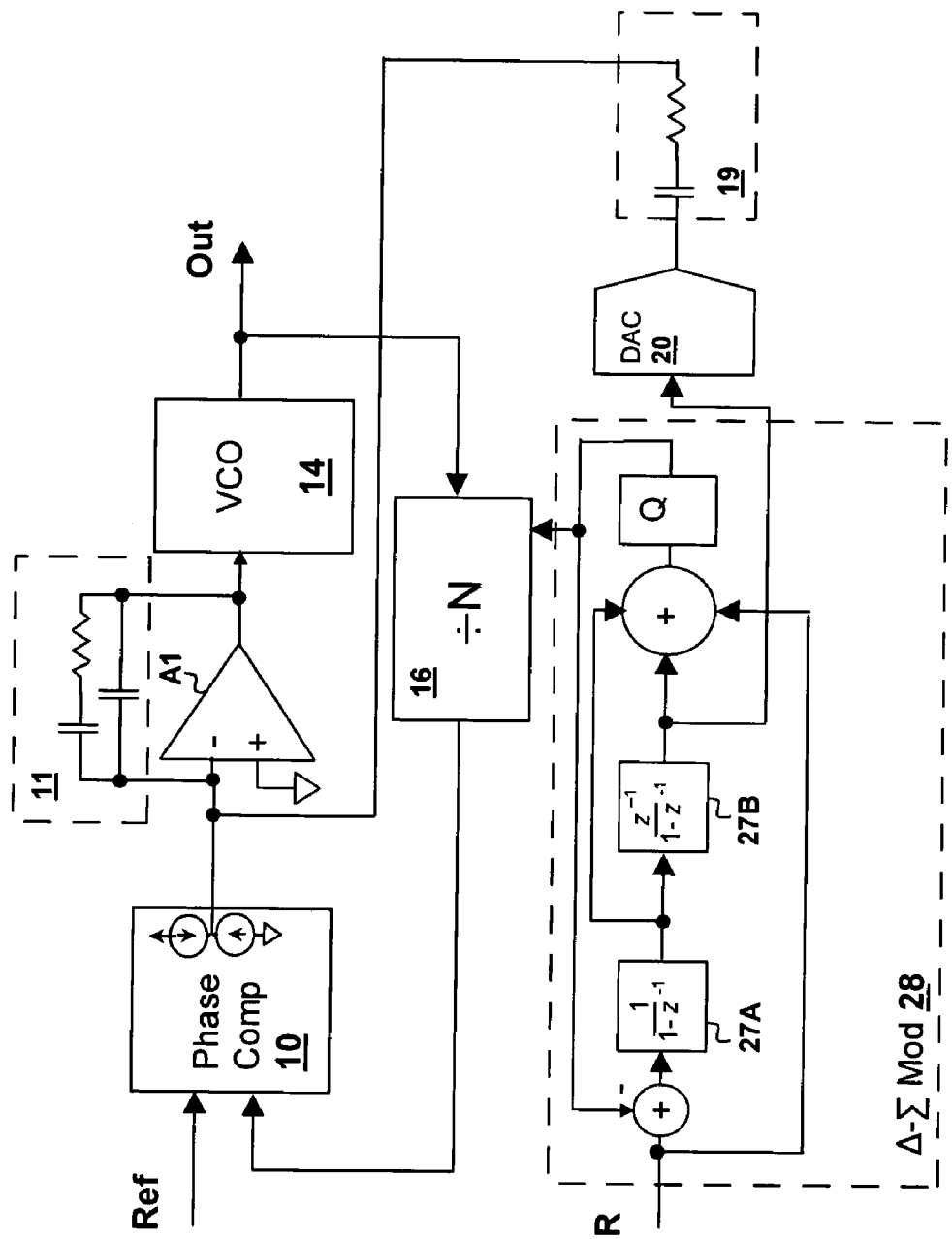
FIG. 2 is a block diagram depicting an apparatus in accordance with another embodiment of the present invention.

Referring now to FIG. 2, a phase-lock loop in accordance with another embodiment of the present invention is shown. The depicted embodiment is similar to the embodiment of FIG. 1, so only differences between the two embodiments will be described below. In the illustrated embodiment, delta-sigma modulator 28 is a second-order feed-forward modulator that includes two integrators 27A and 27B that are used not only to form the modulator, but to provide the twice-integrated quantization error signal as forms part of such a modulator in general practice. A quantizer Q quantizes the modulator output value to a predetermined number of bits determined by the design of the modulator 28 and the most-significant bits of quantizer Q are again provided to divider 16 to adjust the division factor. The output of the dual integration stage formed by integrators 27A and 27B is provided to DAC 20 to form the jitter cancellation signal that is filtered by network 19 in conjunction with the loop filter formed by network 11 and amplifier A1. Other aspects and operation of the depicted circuit are the same as those in the embodiment of FIG. 1.

Figure 3:
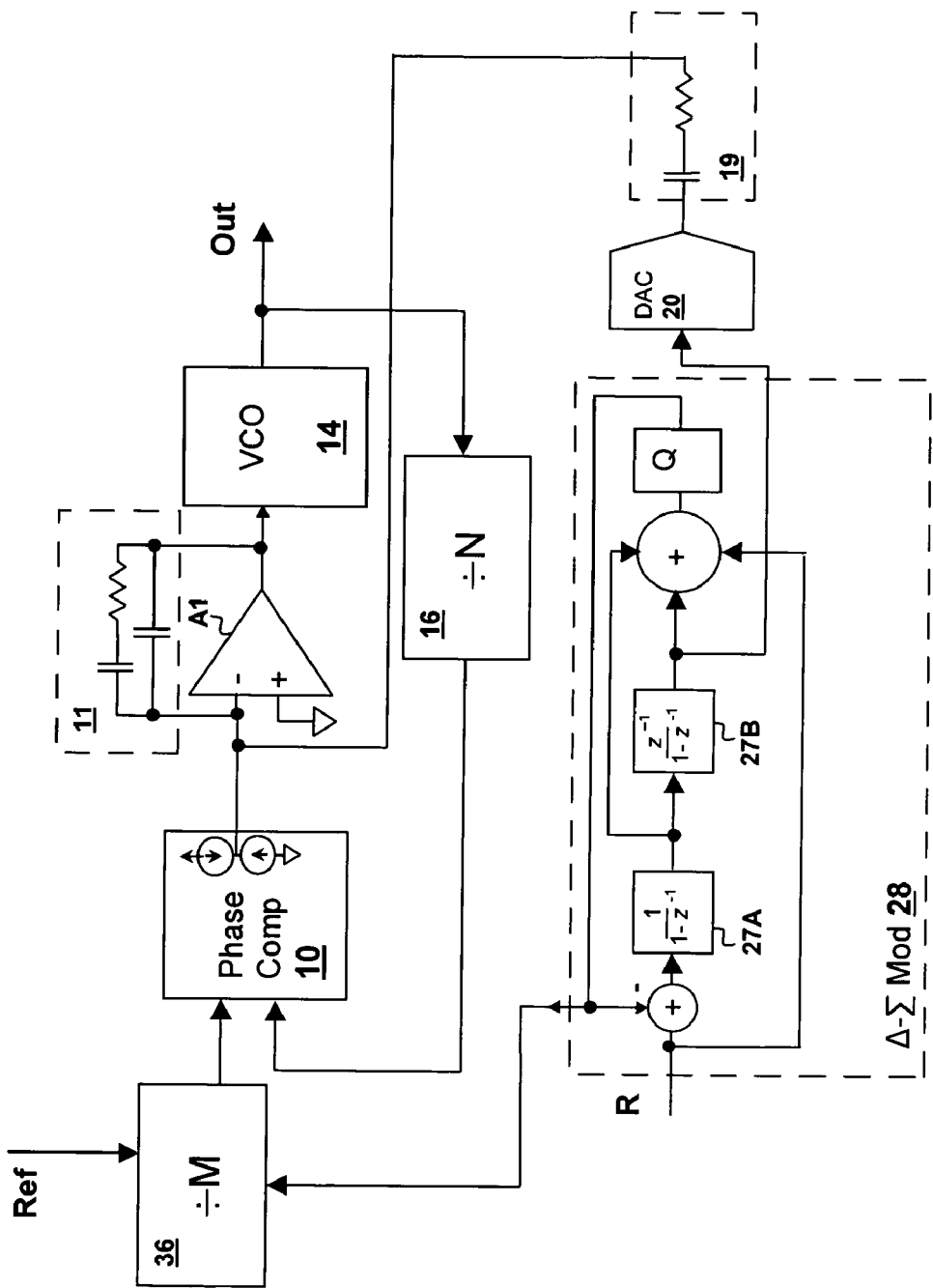
FIG. 3 is a block diagram depicting an apparatus in accordance with yet another embodiment of the present invention.

Referring now to FIG. 3, a phase-lock loop in accordance with yet another embodiment of the present invention is shown. The depicted embodiment is similar to the embodiment of FIG. 2, so only differences between the two embodiments will be described below. In the illustrated embodiment, the same delta-sigma modulator 28 and cancellation signal structure is used, but the output of delta-sigma modulator is used to control the division factor of another divider 36 that scales the frequency of the reference clock signal provided to phase-frequency comparator 10. Divider 16 is thus a fixed integer divider and the PLL generates a frequency equal to the reference clock frequency multiplied by the ratio N/(M+R), where R is the ratio control number between zero and one. Although such circuits have a higher overall phase noise that the circuits of FIGS. 1 and 2, in applications where a fractional −N/M type circuit is advantageous, the jitter cancellation techniques of the present invention may also be advantageously applied. Other aspects and operation of the depicted circuit are the same as those in the embodiment of FIG. 2.

It will be understood that although the illustrative embodiment include oscillators that generate digital signal timebase outputs, receive reference clock signals and include phase comparators that compare such signals and their divisions provided by dividers, signal representations including numeric values corresponding to phase or actual waveform data may form part of a loop in accordance with the present invention. The terms "signal representation" and timebase should be understood to encompass such forms of phase information and the term phase-frequency comparator should be understood broadly to encompass an element that compares phase and frequency or in certain applications phase alone.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A phase-lock loop circuit, comprising:
    a voltage controlled oscillator (VCO) having an output for providing a timebase;
    a phase comparator for comparing a phase of a reference clock to a local timebase derived from said output of said VCO;
    a loop filter for filtering an output of said phase comparator and having an output coupled to an input of said VCO;
    a divider for dividing one of the reference clock and said timebase prior to entering said phase comparator according to a divisor, wherein said divider has an input for receiving an adjustment value that alters the divisor of said divider;
    a delta-sigma modulator for supplying said adjustment value to said divider;
    a cancellation signal generating circuit for measuring a quantization error of said modulator and generating a jitter cancellation signal therefrom; and
    an analog high-pass filter for filtering said jitter cancellation signal and having an output coupled to an input of said loop filter.

2. The phase-lock loop circuit of claim 1, wherein said cancellation signal generating circuit comprises a dual integrator cascade for integrating said quantization error of said delta-sigma modulator.

3. The phase-lock loop circuit of claim 2, wherein said delta-sigma modulator is a second-order feed-forward modulator, and wherein said dual integrator cascade is a second-order integrator of said delta-sigma modulator.

4. The phase-lock loop circuit of claim 2, wherein said cancellation signal generator comprises a pair of integrators forming said dual integrator cascade external to said delta-sigma modulator.

5. The phase-lock loop circuit of claim 2, wherein said dual integrator cascade is a dual numerical integrator providing a digital output and wherein said cancellation signal generating circuit further comprises a digital-to-analog converter for receiving an output of said dual numerical integrator and providing an analog output that is coupled to high-pass filter element.

6. The phase-lock loop circuit of claim 5, wherein said high-pass filter is a resistor-capacitor series network coupled to a summing node of an op-amp implementing said loop filter.

7. The phase-lock loop circuit of claim 1, wherein said divider divides said output of said oscillator to supply said local timebase input to said phase comparator with an average timebase frequency equal to a rational division of said output of said oscillator.

8. The phase-lock loop circuit of claim 1, wherein said divider divides said reference clock to supply said reference clock input to said phase comparator with an average reference frequency equal to a rational division of said reference clock.

9. The phase-lock loop circuit of claim 1, wherein said delta-sigma modulator receives a numerical value corresponding to at least a rational portion of said divisor and generates said input to said divider as a changing multi-bit signal having an average value that causes said divider to divide by a rational divisor.

10. The phase-lock loop circuit of claim 9, wherein said numerical value is a dynamically changing number, whereby said division factor is modulated in real time.

11. A method for generating a timebase, said method comprising:
    phase-locking an analog signal controlled oscillator with a local reference using a divider having a programmable divisor and an analog loop filter;
    generating said divisor from a delta-sigma modulator;
    generating a cancellation signal providing a measure of quantization error in said delta-sigma modulator;
    high-pass filtering said cancellation signal in the analog domain; and
    injecting said filtered cancellation signal into said analog loop filter.

12. The method of claim 11, further comprising doubly integrating a difference between an output and an input to said delta-sigma modulator corresponding to said quantization error and generating said cancellation signal from a result of said doubly integrating.

13. The method of claim 12, wherein a result of said doubly integrating is a digital number and further comprising converting said digital number to an analog signal, and wherein said high-pass filtering filters said analog signal to provide said filtered cancellation signal.

14. The method of claim 12, wherein said doubly integrating is performed as part of the operation of said delta-sigma modulator.

15. The method of claim 12, wherein said doubly integrating is performed outside of the operation of said delta-sigma modulator.

16. A phase-lock loop circuit, comprising:
    a voltage controlled oscillator (VCO) having an output for providing a timebase;
    a divider for dividing said timebase according to a divisor to produce a local timebase, wherein said divider has an input for receiving an adjustment value that alters the divisor of said divider;
    a phase comparator for comparing a phase of a reference clock to said local timebase;
    a delta-sigma modulator for supplying said adjustment value to said divider;
    a loop filter for filtering an output of said phase comparator and having an output coupled to an input of said VCO;
    a cancellation signal generating circuit for measuring a quantization error of said modulator and generating a jitter cancellation signal therefrom; and
    an analog high-pass filter for filtering said jitter cancellation signal and having an output coupled to an input of said loop filter.

17. The phase-lock loop circuit of claim 16, wherein said cancellation signal generating circuit comprises a dual integrator cascade for integrating said quantization error of said delta-sigma modulator.

18. The phase-lock loop circuit of claim 17, wherein said delta-sigma modulator is a second-order feed-forward modulator, and wherein said dual integrator cascade is a second-order integrator of said delta-sigma modulator.

19. The phase-lock loop circuit of claim 17, wherein said cancellation signal generator comprises a pair of integrators forming said dual integrator cascade external to said delta-sigma modulator.

20. The phase-lock loop circuit of claim 17, wherein said dual integrator cascade is a dual numerical integrator providing a digital output and wherein said cancellation signal generating circuit further comprises a digital-to-analog converter for receiving an output of said dual numerical integrator and providing an analog output that is coupled to high-pass filter element.

* * * * *